United States Patent
Chen et al.

(10) Patent No.: US 11,289,303 B2
(45) Date of Patent: Mar. 29, 2022

(54) CALIBRATING METHOD AND CALIBRATING SYSTEM

(71) Applicant: Industrial Technology Research Institute, Hsinchu (TW)

(72) Inventors: Yen-Cheng Chen, Taichung (TW); Chung-Yin Chang, Taichung (TW); Jun-Yi Jiang, Nantou County (TW); Qi-Zheng Yang, Taoyuan (TW); Kai-Ming Pan, Taoyuan (TW); Chen-Yu Kai, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 163 days.

(21) Appl. No.: 16/813,747

(22) Filed: Mar. 10, 2020

(65) Prior Publication Data

US 2021/0225607 A1 Jul. 22, 2021

(30) Foreign Application Priority Data

Jan. 21, 2020 (TW) .................................. 109102235

(51) Int. Cl.
*H01J 37/02* (2006.01)
*G01B 11/275* (2006.01)

(52) U.S. Cl.
CPC ........ *H01J 37/026* (2013.01); *G01B 11/2755* (2013.01)

(58) Field of Classification Search
CPC . G06K 9/6262; H01J 37/026; G01B 11/2755; G01B 21/042; G01B 5/008; B25J 9/1692; B25J 19/0095
See application file for complete search history.

(56) References Cited

U.S. PATENT DOCUMENTS

| 4,505,049 A | 3/1985 | Kuno et al. |
| 4,642,781 A * | 2/1987 | Szonyi ................ B25J 9/1692 |
| | | 700/254 |

(Continued)

FOREIGN PATENT DOCUMENTS

| CN | 105073348 | 11/2015 |
| CN | 105091807 | 11/2015 |

(Continued)

OTHER PUBLICATIONS

Jorge Santolaria, Modelling and Calibration Technique of Laser Triangulation, Sensors for Integration in Robot Arms and Articulated Arm Coordinate Measuring Machines, Sensors 2009, pp. 7374-7396 (Year: 2009).*

(Continued)

*Primary Examiner* — Tung S Lau
(74) *Attorney, Agent, or Firm* — JCIPRNET

(57) ABSTRACT

A calibrating method is provided including the following steps. A type of a first sensor and a type of a first sensor carrier are determined according to an external shape of a first object. The first sensor is carried by the first sensor carrier, and a relative coordinate of the first object is measured by the first sensor. The relative coordinate of the first object is compared with a predetermined coordinate of the first object to obtain a first object coordinate error, and the first object coordinate error is corrected. After the first object coordinate error is corrected, the first object is driven to perform an operation on a second object or the second object is driven to perform the operation on the first object. A calibrating system is also provided.

11 Claims, 8 Drawing Sheets

(56) References Cited

U.S. PATENT DOCUMENTS

| | | | |
|---|---|---|---|
| 4,831,549 A * | 5/1989 | Red | B25J 9/1692 700/254 |
| 5,177,563 A | 1/1993 | Everett et al. | |
| 6,812,665 B2 * | 11/2004 | Gan | B25J 9/1692 318/568.11 |
| 6,822,412 B1 | 11/2004 | Gan et al. | |
| 6,941,192 B2 | 9/2005 | Tang et al. | |
| 9,457,470 B2 | 10/2016 | Lundberg | |
| 9,505,128 B1 * | 11/2016 | Kesil | B25J 9/163 |
| 9,652,077 B2 | 5/2017 | Jenkinson | |
| 2003/0200042 A1 * | 10/2003 | Gan | B25J 9/1692 702/105 |
| 2009/0118864 A1 | 5/2009 | Eldridge et al. | |
| 2011/0037989 A1 | 2/2011 | Pettersson | |
| 2015/0025683 A1 * | 1/2015 | Amano | B25J 9/1692 700/254 |
| 2016/0346932 A1 * | 12/2016 | Deng | B25J 9/1692 |

FOREIGN PATENT DOCUMENTS

| | | |
|---|---|---|
| CN | 205734940 | 11/2016 |
| CN | 107650144 | 2/2018 |
| TW | M530737 | 10/2016 |
| TW | I557522 | 11/2016 |
| TW | I601611 | 10/2017 |
| TW | 201805129 | 2/2018 |

OTHER PUBLICATIONS

Francesco Leali, et al., "A Calibration Method for the Integrated Design of Finishing Robotic Workcells in the Aerospace Industry." Robotics in Smart Manufacturing, Jan. 2013, pp. 37-48.

Federico Toffano, "An Autonomous System for the Evaluation of a Robot Tool Center Point using Computer Vision," Master's thesis, Apr. 2015, Dipartimento Di Ingegneria Dell 'Informazione, Universita Degli Studi Di Padova, pp. 1-76.

Xiaohu Xu, et al., "Calibration and accuracy analysis of robotic belt grinding system using the ruby probe and criteria sphere." Robotics and Computer-Integrated Manufacturing, vol. 51, Jun. 2018, 189-201.

Christof Borrmann, et al., "Enhanced Calibration of Robot Tool Centre Point Using Analytical Algorithm." International Journal of Materials Science and Engineering, vol. 3, No. 1, Mar. 2015, pp. 12-18.

Hao Gu, et al., "Quick Robot Cell Calibration for Small Part Assembly." The 14th IFToMM World Congress, Oct. 25-30, 2015, pp. 1-6.

Xiongzi Li, et al., "Toward General Industrial Robot Cell Calibration." 2011 IEEE 5th International Conference on Robotics, Automation and Mechatronics, Sep. 17-19, 2011, pp. 137-142.

"Office Action of Taiwan Counterpart Application", dated Aug. 11, 2021, p. 1-p. 3.

* cited by examiner

CALIBRATING METHOD AND CALIBRATING SYSTEM

CROSS-REFERENCE TO RELATED APPLICATION

This application claims the priority benefit of Taiwan application no. 109102235, filed on Jan. 21, 2020. The entirety of the above-mentioned patent application is hereby incorporated by reference herein and made a part of this specification.

TECHNICAL FIELD

The technical field relates to a calibrating method and a calibrating system.

BACKGROUND

Robots have a long development history and have been widely used in fields such as automated manufacturing and processing and so on. Existing robot programming methods include online teaching and offline programming. The online teaching is to manually teach a robot, including to guide a tool on the robot to operate in a predetermined stroke along a desired path during programming, thereby defining a path to be followed by the robot in operation. However, such online teaching is time-consuming. Particularly, in a case of a workpiece having a complex geometric shape, it is hard to determine an accurate stroke for the tool with an operator's naked eye in high-accuracy applications such as laser cutting, welding and so on. Therefore, it takes a lot of time to perform online teaching even for operators with rich programming experience. In contrast, the offline programming uses a virtual-real integration method in which a path to be followed by the robot in operation is first simulated by a computer, and is then put into practical operation. This method has overcome the defects of online teaching of being labor-consuming and time-consuming. However, as efficiency and accuracy requirements for automated manufacturing and processing become more stringent, very high accuracy requirements have been imposed on actual and relative coordinates of robots, tools, and workpieces. In addition, as the use of robots becomes more extensive, they are able to support a wider variety of workpieces and tools. Therefore, a fast, accurate and highly universal robot calibrating method becomes important.

SUMMARY

Exemplary embodiments provide a calibrating method and a calibrating system.

One exemplary embodiment provides a calibrating method including the following. A type of a first sensor and a type of a first sensor carrier are determined according to an external shape of a first object. The first sensor is carried by the first sensor carrier, and an actual coordinate of the first object is measured by the first sensor. The actual coordinate of the first object is compared with a predetermined coordinate of the first object to obtain a first object coordinate error, and the first object coordinate error is corrected. After the first object coordinate error is corrected, one of the first object and a second object is driven to perform an operation on the other of the first object and the second object.

One exemplary embodiment provides a calibrating system, the calibrating system including a first sensor, a first sensor carrier, a setting module, a comparison module, a correction module, and a control module. The first sensor measures a first object actual coordinate of a first object. The first sensor carrier carries the first sensor. The setting module determines a type of the first sensor and a type of the first sensor carrier according to an external shape of the first object. The comparison module compares the first object actual coordinate with a first object predetermined coordinate to obtain a first object coordinate error. The correction module corrects the first object coordinate error. The control module drives one of the first object and a second object to perform an operation on the other of the first object and the second object.

Several exemplary embodiments accompanied with figures are described in detail below to further describe the disclosure in details.

DESCRIPTION OF THE EMBODIMENTS

Figure 1:
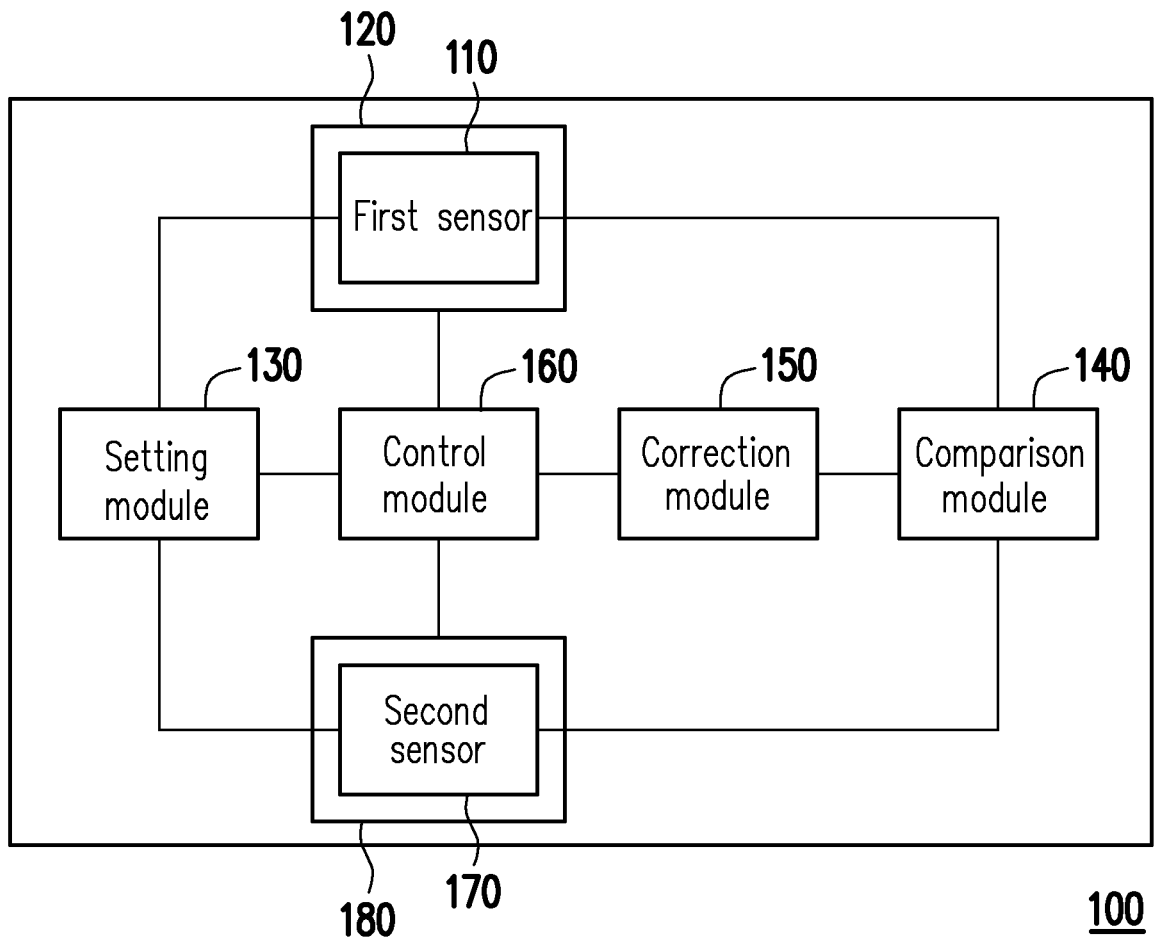
FIG. 1 is a schematic diagram of a calibrating system according to an exemplary embodiment.
Figure 2:
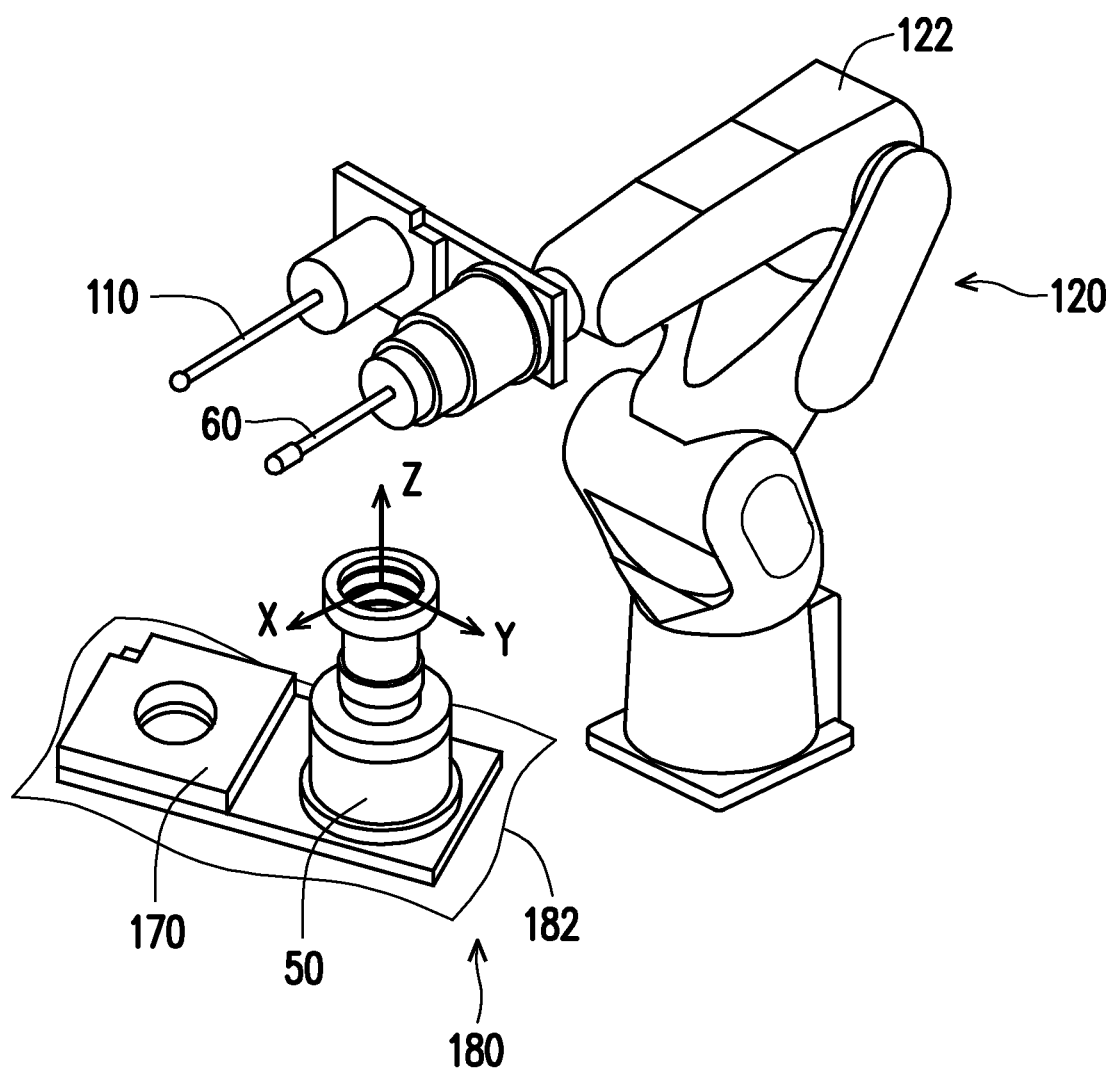
FIG. 2 illustrates some components of the calibrating system of FIG. 1.

FIG. 1 is a schematic diagram of a calibrating system according to an exemplary embodiment. FIG. 2 illustrates some components of the calibrating system of FIG. 1. Referring to FIG. 1 and FIG. 2, a calibrating system 100 of this embodiment includes a first sensor 110, a first sensor carrier 120, a setting module 130, a comparison module 140, a correction module 150, a control module 160, a second sensor 170, and a second sensor carrier 180. The setting module 130, the comparison module 140, the correction module 150 and the control module 160 may be integrated into a single computer apparatus, but the disclosure is not limited thereto.

The setting module 130 is adapted to determine the type of the first sensor 110 and the type of the first sensor carrier 120 according to an external shape of a first object 50, and is adapted to determine the type of the second sensor 170 and the type of the second sensor carrier 180 according to an external shape of a second object 60. The term "external shape" refers to features such as points, lines, faces, circles, ellipses, curved surfaces, curves and contours of the appearance of an object, and these external shape features may be input to the setting module 130 by a user. In this embodiment, the first object 50 is, for example, a workpiece to be processed, and the second object 60 is, for example, a tool for processing the workpiece. The first sensor 110 is, for example, a probe, and the second sensor 170 is, for example, a tool setter. The first sensor carrier 120 includes, for example, a robot 122, and the second sensor carrier 180 includes, for example, a working platform 182. The second object 60 and the first sensor 110 are adapted to be mounted on the robot 122, and the first object 50 and the second sensor 170 are adapted to be mounted on the working platform 182. The robot 122 is, for example, a multi-axis robot capable of driving the second object 60 and the first sensor 110 to move along three movement axes and three rotational axes.

Before the first object 50 is processed using the second object 60, in order to correct errors in the mounting position and angle of the first object 50 and errors in the mounting position and angle of the second object 60, in this embodiment, the first sensor 110 is adapted to measure a first object actual coordinate of the first object 50 relative to the robot 122, and the second sensor 170 is adapted to measure a second object actual coordinate of the second object 60 relative to the robot 122. The comparison module 140 is adapted to calculate and compare the first object actual coordinate with a first object predetermined coordinate to obtain a first object coordinate error, and is also adapted to calculate and compare the second object actual coordinate with a second object predetermined coordinate to obtain a second object coordinate error. The first object predetermined coordinate and the second object predetermined coordinate are obtained, for example, by offline programming. The correction module 150 is adapted to correct the first object coordinate error and the second object coordinate error. The control module 160 is adapted to, after the errors are corrected, control the robot 122 to drive the second object 60 to perform the processing operation on the first object 50.

The first object actual coordinate is, for example, a coordinate of the geometric center of the first object 50 relative to a distal end of the robot 122, or a coordinate of an appropriate reference point on the first object 50 relative to an appropriate reference point on the robot 122. The disclosure is not limited thereto. The second object actual coordinate is, for example, a coordinate of the geometric center of the second object 60 relative to a distal end of the robot 122, or a coordinate of an appropriate reference point on the second object 60 relative to an appropriate reference point on the robot 122. The disclosure is not limited thereto.

As mentioned above, in this embodiment, the first sensor 110 and the second sensor 170 are used to measure the errors in the actual coordinates of the first object 50 and the second object 60 relative to the robot 122, and accordingly correct the errors to make the actual coordinates match the information obtained by offline programming, thereby improving the accuracy of the robot 122 for subsequent operations. In addition, in this embodiment, an automation system is used to promptly select an appropriate type of sensor and an appropriate type of sensor carrier according to the external shapes of the first object 50 and the second object 60, such that the coordinates of various objects can be efficiently sensed and calibrated. Thus, the calibrating system of this embodiment is highly universal.

In other embodiments, the first object 50 and the second object 60 may be other types of objects, and the robot 122 is adapted to drive the second object 60 to perform other types of operations on the first object 50. The disclosure is not limited thereto.

In the above embodiment, the number of sensors is two (the first sensor 110 and the second sensor 170), but the disclosure is not limited thereto. It is also possible to only measure a coordinate of the first object 50 by the first sensor 110 and perform a corresponding error correction, without measuring a coordinate of the second object 60 by the second sensor 170, and vice versa.

Figure 3:
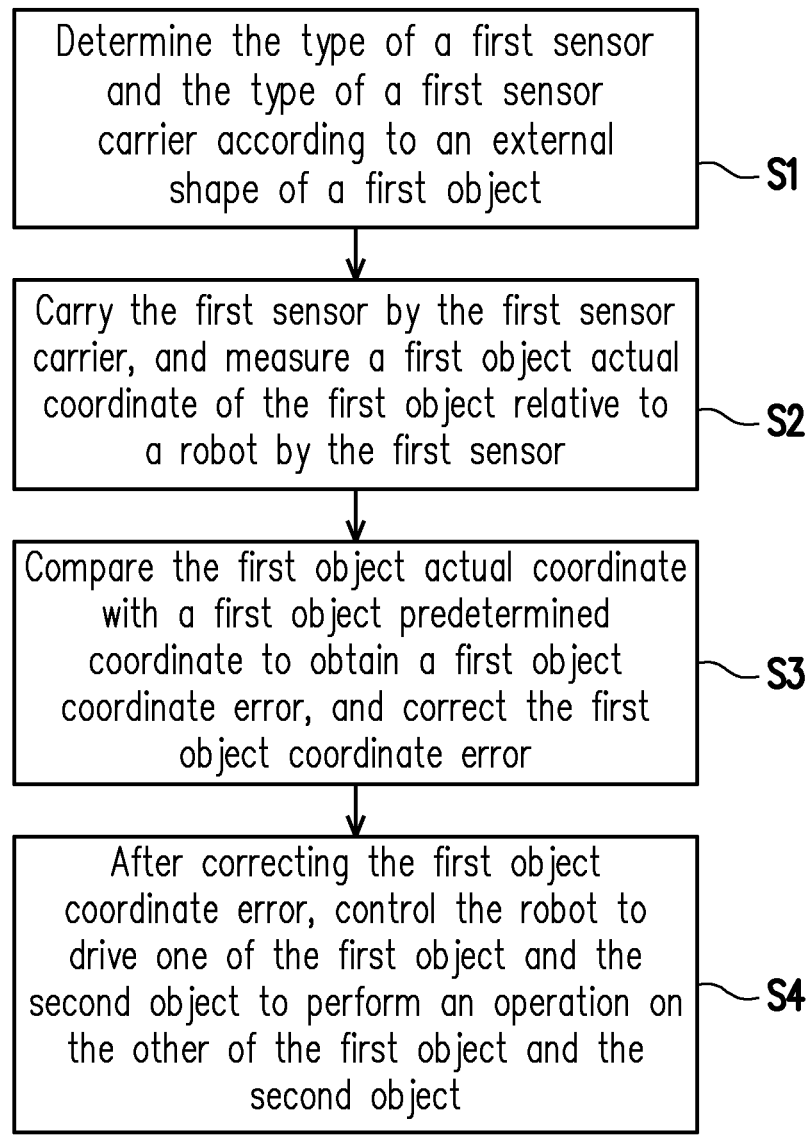
FIG. 3 is a flowchart of a calibrating method according to an exemplary embodiment.

The following describes a calibrating method according to an exemplary embodiment with reference to the drawings. FIG. 3 is a flowchart of a calibrating method according to an exemplary embodiment. Referring to FIG. 3, first, the type of the first sensor 110 and the type of the first sensor carrier 120 are determined according to the external shape of the first object 50 (step S1). The first sensor 110 is carried by the first sensor carrier 120, and the first object actual coordinate of the first object 50 relative to the robot 122 is measured by the first sensor 110 (step S2). The first object actual coordinate is compared with the first object predetermined coordinate to obtain the first object coordinate error, and the first object coordinate error is corrected (step S3). After the first object coordinate error is corrected, the robot 122 is controlled to drive one of the first object 50 and the second object 60 to perform an operation on the other of the first object 50 and the second object 60 (step S4).

Step S1 may further include determining the type of the second sensor 170 and the type of the second sensor carrier 180 according to the external shape of the second object 60. Step S2 may further include carrying the second sensor 170 by the second sensor carrier 180, and measuring the second object actual coordinate of the second object 60 relative to the robot 122 by the second sensor 170. Step S3 may further include comparing the second object actual coordinate with the second object predetermined coordinate to obtain the second object coordinate error, and correcting the second object coordinate error. Accordingly, step S4 may include, after correcting the first object coordinate error and the second object coordinate error, controlling the robot 122 to drive one of the first object 50 and the second object 60 to perform an operation on the other of the first object 50 and the second object 60.

In step S1, the setting module 130 selects a most appropriate type of sensor and a most appropriate type of sensor carrier according to the external shape features of the first object 50, and further sets measurement feature parameters related to the selected type of sensor and actuation control parameters related to the selected type of sensor carrier. The measurement feature parameters and the actuation control parameters may be stored in a database of the calibrating system for future use. In addition, the object coordinate errors calculated in step S3 may also be stored in the database, and may be used in combination with the measurement feature parameters and the actuation control parameters as reference data for future calibrating operations.

Figure 4:
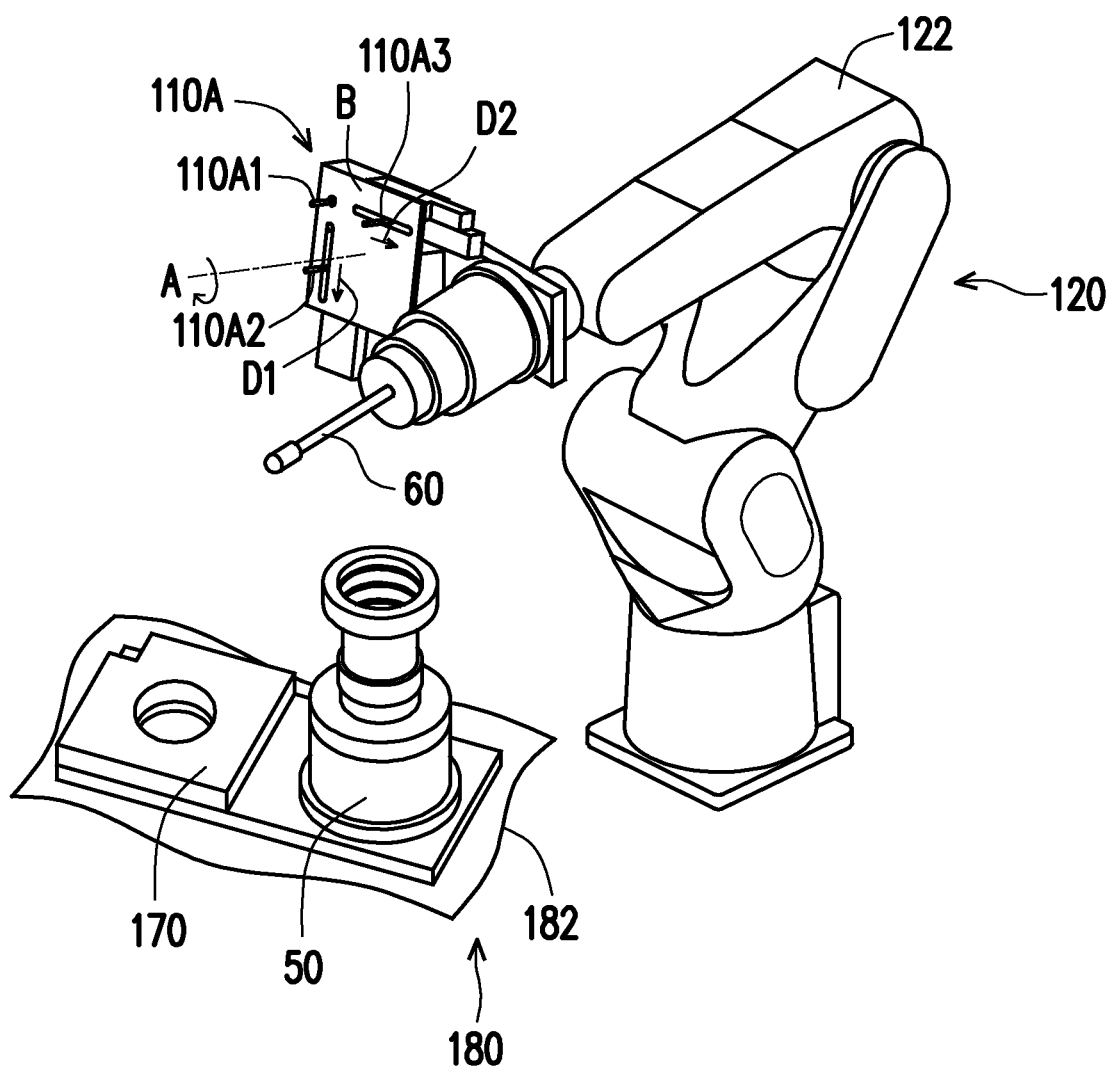
FIG. 4 shows some components of a calibrating system according to another exemplary embodiment.

Examples of the selected type of sensor carrier include, in addition to the robot 122 and the working platform 182 as shown in FIG. 2, other types of single-axis platforms, dual-axis platforms, three-axis platforms, rotary tables, gantry mechanisms and so on. Examples of the selected type of sensor include, in addition to the probe as shown in FIG. 2, other types of sensors such as coordinate measuring machines, linear displacement meters, profilometers, laser sensors, image sensors and so on. The above is described below with reference to the drawings. FIG. 4 shows some components of a calibrating system according to another exemplary embodiment. In the embodiment shown in FIG. 4, the first sensor 110 of FIG. 2 is replaced by a first sensor 110A. The first sensor 110A includes a probe 110A1 that is fixed to its base B and two probes 110A2 and 110A3 that are respectively movable in two directions D1 and D2 relative to the base B. The base B can be rotated along an axis A perpendicular to the two directions D1 and D2 to more accurately measure various external shape features such as points, lines, faces, circles and so on, to accordingly accurately determine the first object actual coordinate of the first object 50.

In step S1, the setting module 130 further preliminarily sets a position of the first object 50, so that the robot 122 can find the first object 50 smoothly and quickly, and then the first object 50 is finely measured by search. Specifically, the information obtained by offline programming that is related to the position of the first object 50 may be used for the preliminary setting, or the position of the first object 50 may be manually input by the user, or the distal end of the robot 122 may be operated to where the first object 50 is located and the position of the distal end of the robot 122 at the moment is recorded by the user. The disclosure is not limited thereto. After step S1 is completed, the setting module 130 transmits relevant information to the first sensor 110 and the robot 122 through wireless or wired communication, so that the first sensor 110 and the robot 122 perform a corresponding coordinate measurement operation in step S2.

Before step S2 is performed, a first sensor actual coordinate of the first sensor 110 relative to the robot 122 is measured, that is, the first sensor 110 is pre-calibrated. Then, in step 2, the first object actual coordinate of the first object 50 relative to the robot 122 is measured according to the first sensor actual coordinate, so as to improve measurement accuracy. Specifically, in an example where the first sensor 110 is a probe, when the pre-calibration is performed, the robot 122 is first controlled to drive the first sensor 110 to move a stroke so that the first sensor 110 contacts an external structure, and then the first sensor actual coordinate is calculated according to the stroke and a position of the external structure. The external structure may be any appropriate physical structure with known position information, and the disclosure is not limited thereto. In this way, the pre-calibration of the first sensor 110 can be completed without using an additional calibration instrument.

Figure 5:
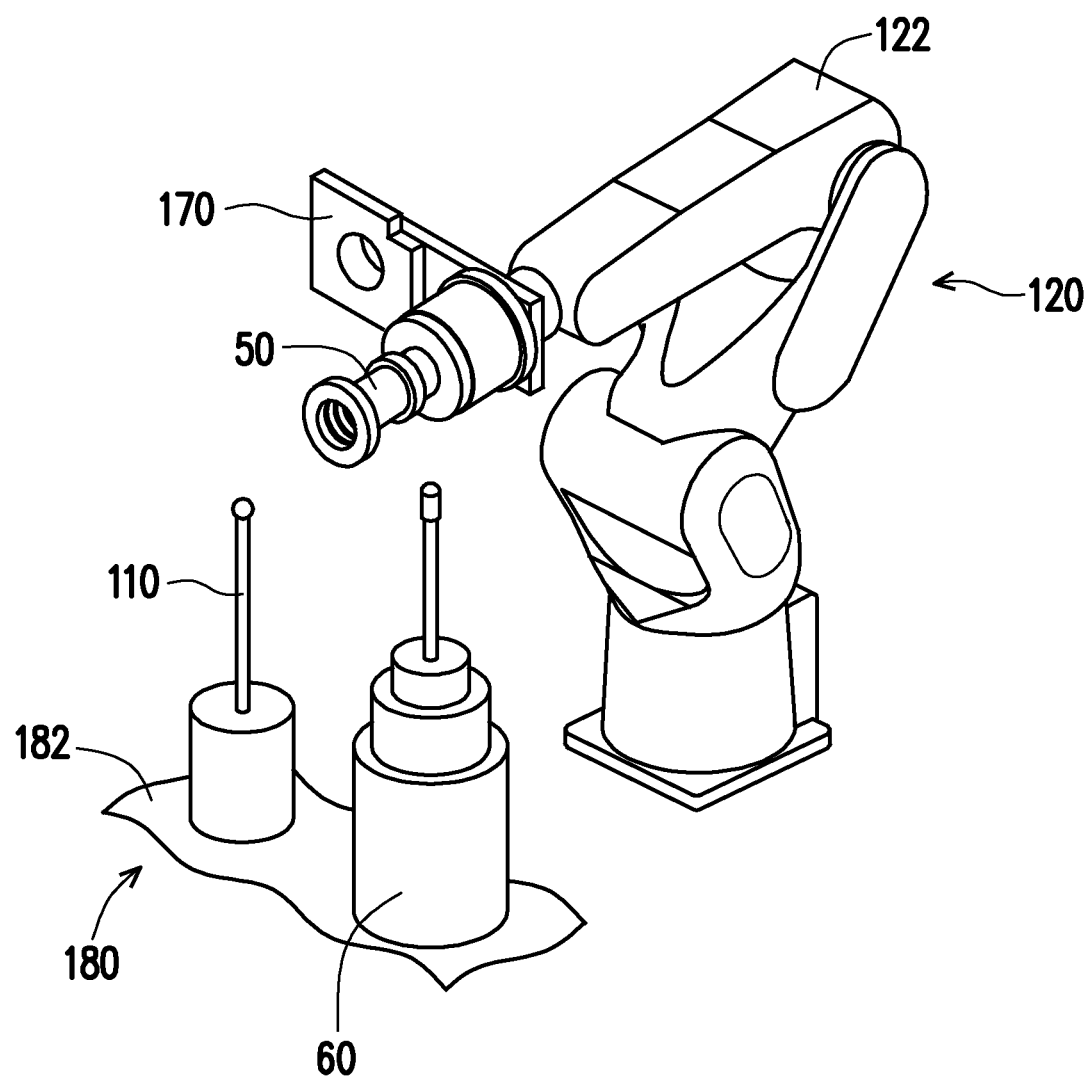
FIG. 5 illustrates some components of a calibrating system according to another exemplary embodiment.

FIG. 5 illustrates some components of a calibrating system according to another exemplary embodiment. The embodiment shown in FIG. 5 is different from the embodiment shown in FIG. 2 in that the first object 50 and the second sensor 170 of FIG. 5 are mounted on the robot 122, and the first sensor 110 and the second object 60 are mounted on the working platform 182. In FIG. 5, the measurement method performed by the first sensor 110 on the first object 50 and the measurement method performed by the second sensor 170 on the second object 60 are similar to those described in the foregoing embodiments and will not be described again here. In addition, the first sensor 110A of FIG. 4 or other appropriate type of sensor may be configured to be mounted on the working platform 182 of FIG. 5 to replace the first sensor 110. The disclosure is not limited thereto.

Figure 6:
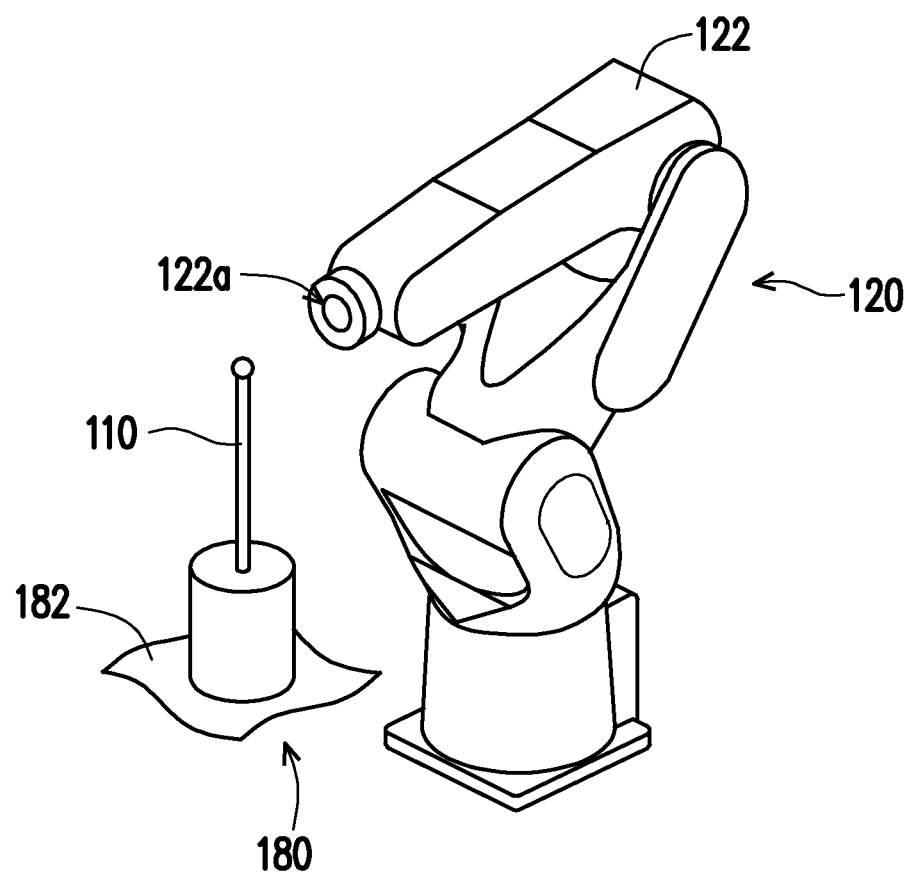
FIG. 6 illustrates that a robot of FIG. 5 is not equipped with a first object and a second sensor.

With the configuration of FIG. 5, the first sensor 110 is pre-calibrated in a slightly different way from that described above and is as follows. FIG. 6 illustrates that a robot of FIG. 5 is not equipped with a first object and a second sensor. Specifically, in an example where the first sensor 110 is a probe and the second sensor 170 is a tool setter, when the pre-calibration is performed on the first sensor 110, as shown in FIG. 6, the robot, as shown in FIG. 6, is not equipped with the first object 50 and the second sensor 170. The robot 122 of FIG. 6 is controlled to move a stroke, so that a distal end 122a of the robot 122 or an object mounted at the distal end 122a contacts the first sensor 110, and then the first sensor actual coordinate of the first sensor 110 is obtained according to the stroke. In addition, when the pre-calibration is performed on the second sensor 170, the robot 122, as shown in FIG. 5, needs to be equipped with the second sensor 170. The robot 122 is controlled to drive the second sensor 170 to move a stroke, so that the second sensor 170 contacts the first sensor 110, and then the second sensor actual coordinate is obtained according to the stroke and the first sensor actual coordinate, wherein the first sensor actual coordinate is obtained by pre-calibrating the first sensor 110 as described above.

Figure 7:
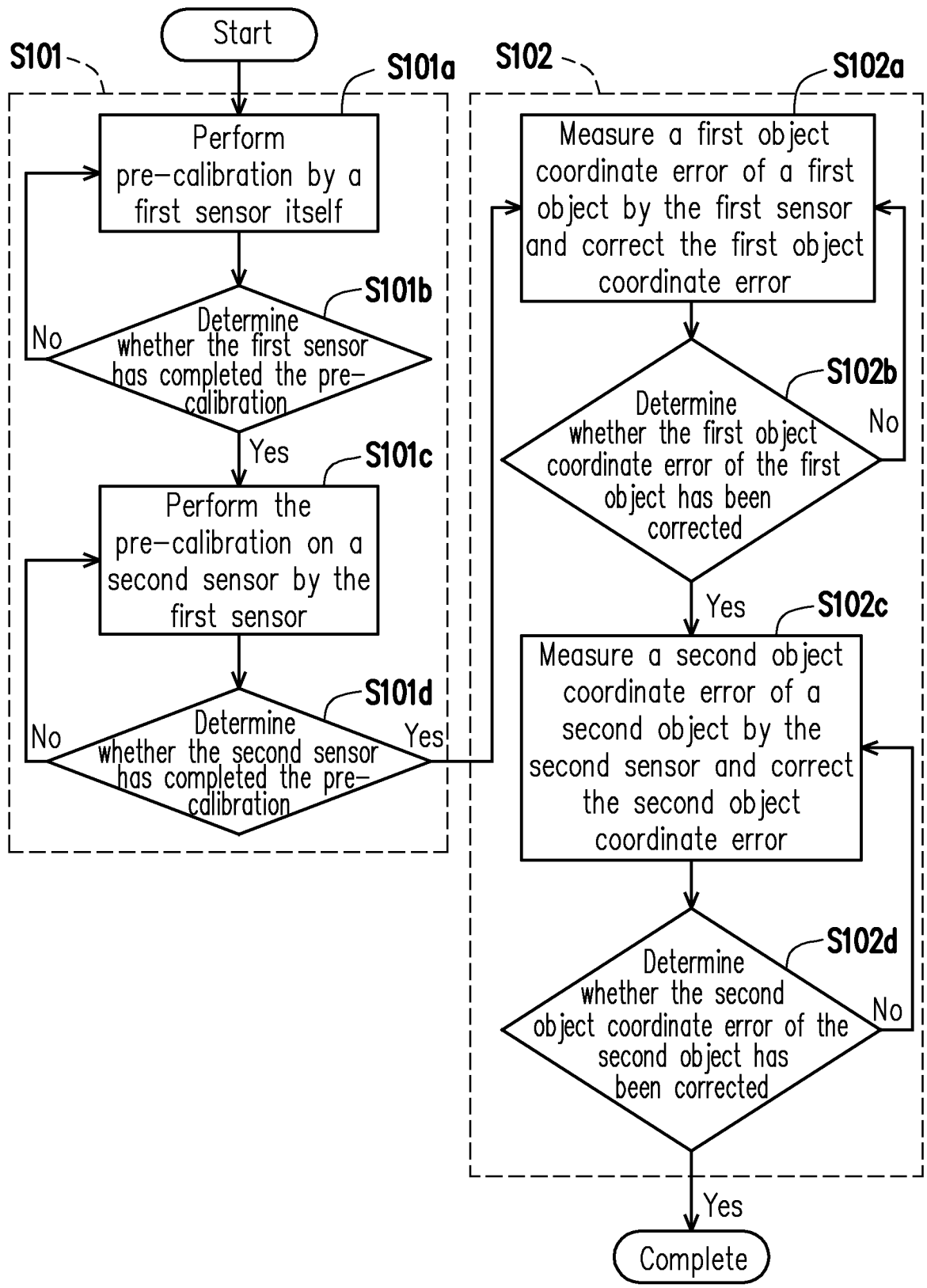
FIG. 7 illustrates steps of a calibrating method according to an exemplary embodiment.

A flowchart of a calibrating method including the pre-calibration of the second sensor 170 corresponding to the embodiments shown in FIG. 5 and FIG. 6 is described hereinafter with reference to the drawings. FIG. 7 illustrates steps of a calibrating method according to an exemplary embodiment. The steps of the calibrating method of FIG. 7 include a pre-calibration step S101 for a sensor and a coordinate correction step S102 for an object. The pre-calibration step S101 corresponds to, for example, the above pre-calibrations of the first sensor 110 and the second sensor 170, and the coordinate correction step S102 corresponds to, for example, steps S1 to S4 of FIG. 3. In detail, in the pre-calibration step S101, the pre-calibration is performed by the first sensor 110 itself (step S101a), and whether the first sensor 110 has completed the pre-calibration is determined (step S101b). If not, the process goes back to step S101a. If yes, the pre-calibration is performed on the second sensor 120 by the first sensor 110 (step S101c), and whether the second sensor 120 has completed the pre-calibration is determined (step S101d). If not, the process goes back to step S101c. If yes, the process goes to the coordinate correction step S102, in which the first object coordinate error of the first object 50 is measured by the first sensor 110 and the first object coordinate error is corrected (step S102a). Whether the first object coordinate error of the first object 50 has been corrected is determined (step S102b). If not, the process goes back to step S102a. If yes, the second object coordinate error of the second object 60 is measured by the second sensor 170 and the second object coordinate error is corrected (step S102c). Whether the second object coordinate error of the second object 60 has been corrected is determined (step S102b). If not, the process goes back to step S102c. If yes, the calibration is completed.

In the above embodiments, the first and second object predetermined coordinates may include a plurality of object predetermined coordinate values (e.g., predetermined displacement values and rotation values in three axial directions), the first and second object actual coordinates may include a plurality of actual coordinate values (e.g., actual displacement values and rotation values in the three axial directions) corresponding to the object predetermined coordinate values, and the first and second object coordinate errors may correspondingly include a plurality of coordinate error values (e.g., displacement error values and rotation error values in the three axial directions) respectively corresponding to the actual coordinate values. Following the above, in the foregoing embodiments, the coordinate measurement and error correction are performed by gradually compensating the coordinate error values. An example of measuring and correcting the coordinate error values of the first object 50 in FIG. 2 is described below.

Figure 8:
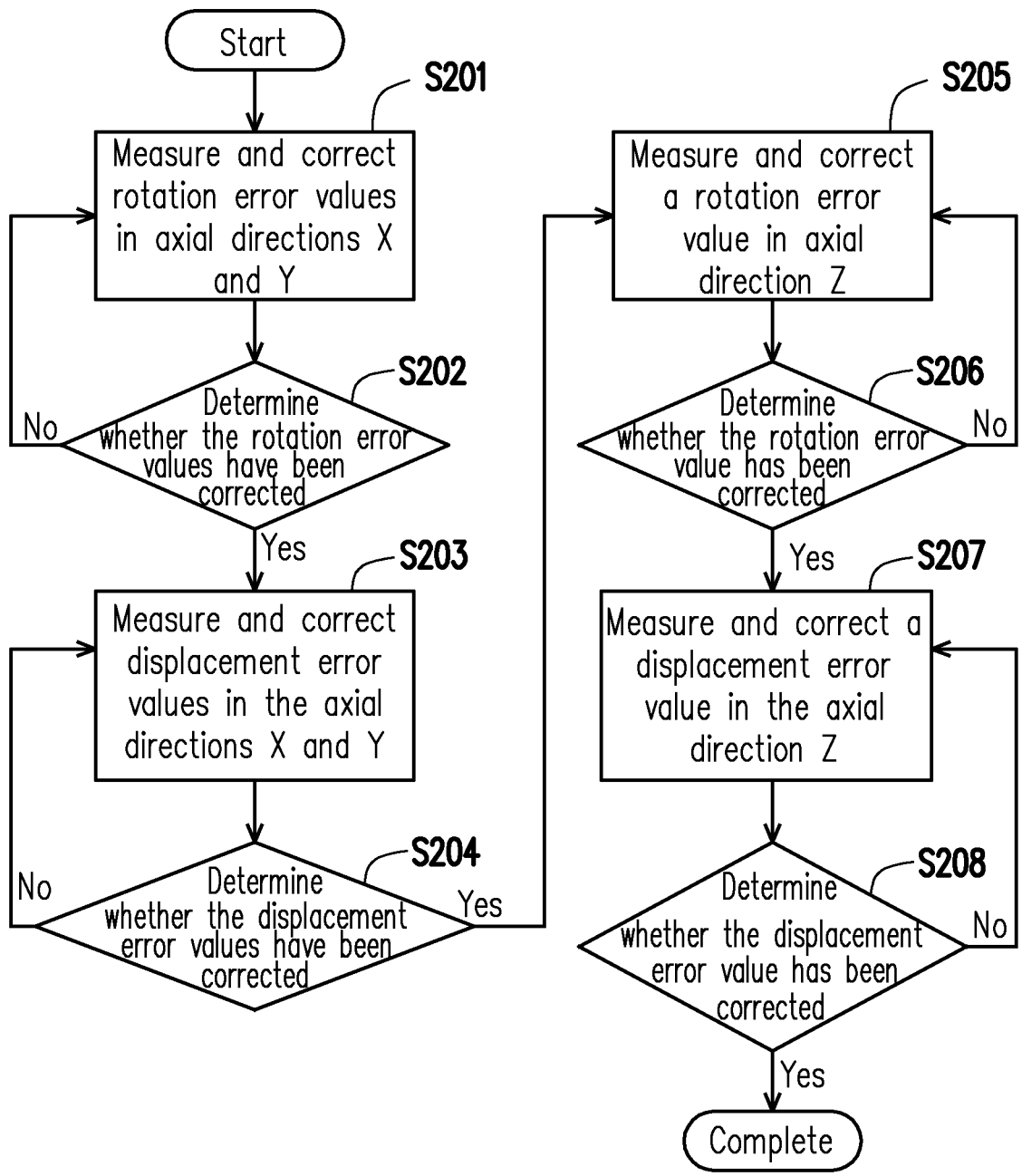
FIG. 8 illustrates a step of measuring the first object by a first sensor of FIG. 2.

FIG. 8 illustrates a step of measuring the first object by a first sensor of FIG. 2. Referring to FIG. 8, first, in step S201, actual rotation values of the first object 50 in axial directions X and Y are measured by the first sensor 110, the actual rotation values are compared with predetermined rotation values in the axial directions X and Y to obtain rotation error values in the axial directions X and Y, and the rotation error values are corrected. Neither the above description nor the following steps limit the choice and order of the axial directions herein. In step S202, whether the rotation error values have been corrected is determined. If not, the process goes back to step S201. If yes, in step S203, actual displacement values of the first object 50 in the axial directions X and Y are measured by the first sensor 110, the actual displacement values are compared with predetermined displacement values in the axial directions X and Y to obtain displacement error values in the axial directions X and Y, and the displacement error values are corrected. In step S204, whether the displacement error values have been corrected is determined. If not, the process goes back to step S203. If yes, in step S205, an actual rotation value of the first object 50 in an axial direction Z is measured by the first sensor 110, the actual rotation value is compared with a predetermined rotation value in the axial direction Z to obtain a rotation error value in the axial direction Z, and the rotation error value is corrected. In step S206, whether the rotation error value has been corrected is determined. If not, the process goes back to step S205. If yes, in step S207, an actual displacement value of the first object 50 in the axial direction Z is measured by the first sensor 110, the actual displacement value is compared with a predetermined displacement value in the axial direction Z to obtain a displacement error value in the axial direction Z, and the displacement error value is corrected. In step S208, whether the displacement error value has been corrected is determined. If not, the process goes back to step S207. If yes, the calibration is completed.

In steps S201, S203, S205 and S207, the method of correcting a rotation/displacement error value is, for example, adjusting a position/angle of the first object 50 according to an error value to compensate the error value, or adjusting a displacement/rotation amount of the robot 122 according to an error value to compensate the error value. The disclosure is not limited thereto. The measurement and correction methods for the second object 60 in FIG. 2 are the same or similar to those described above, and will not be described again here.

What is claimed is:

1. A calibrating system adapted to be connected to a robot, the calibrating system comprising:
   a first sensor, adapted to measure a first object actual coordinate of a first object relative to the robot;
   a first sensor carrier, adapted to carry the first sensor;
   a setting module, adapted to determine a type of the first sensor and a type of the first sensor carrier according to an external shape of the first object;
   a comparison module, adapted to compare the first object actual coordinate with a first object predetermined coordinate to obtain a first object coordinate error;
   a correction module, adapted to correct the first object coordinate error; and
   a control module, adapted to control the robot to drive one of the first object and a second object to perform an operation on the other of the first object and the second object.

2. The calibrating system as claimed in claim 1, wherein the setting module is adapted to determine the first sensor carrier to be the robot according to the external shape of the first object.

3. The calibrating system as claimed in claim 1, wherein the first object is mounted on one of the robot and a working platform, and the first sensor and the second object are mounted on the other of the robot and the working platform.

4. The calibrating system as claimed in claim 1, wherein the first object predetermined coordinate comprises a plurality of object predetermined coordinate values, the first object actual coordinate comprises a plurality of actual coordinate values respectively corresponding to the plurality of object predetermined coordinate values, and the first object coordinate error comprises a plurality of coordinate error values respectively corresponding to the plurality of actual coordinate values,
   the first sensor is adapted to measure at least one of the plurality of actual coordinate values, the comparison module is adapted to compare the at least one of the plurality of actual coordinate values with a corresponding at least one of the plurality of object predetermined coordinate values to obtain a corresponding at least one of the plurality of coordinate error values, and the correction module is adapted to correct the at least one of the plurality of coordinate error values,
   after the at least one of the plurality of coordinate error values is corrected, the first sensor is adapted to measure at least another of the plurality of actual coordinate values, the comparison module is adapted to compare the at least another of the plurality of actual coordinate values with the corresponding at least one of the plurality of object predetermined coordinate values to obtain a corresponding at least another of the plurality of coordinate error values, and the correction module is adapted to correct the at least another of the plurality of coordinate error values.

5. The calibrating system as claimed in claim 1, wherein the first sensor is adapted to measure the first object actual coordinate according to a first sensor actual coordinate of the first sensor relative to the robot.

6. The calibrating system as claimed in claim 1, comprising:
   a second sensor, adapted to measure a second object actual coordinate of the second object relative to the robot; and
   a second sensor carrier, adapted to carry the second sensor,
   wherein the setting module is adapted to determine a type of the second sensor and a type of the second sensor carrier according to an external shape of the second object;
   the comparison module is adapted to compare the second object actual coordinate with a second object predetermined coordinate to obtain a second object coordinate error;
   the correction module is adapted to correct the second object coordinate error.

7. The calibrating system as claimed in claim 5, wherein the first sensor is mounted on the working platform, and the control module is adapted to control the robot to move a stroke to contact the first sensor, and to obtain the first sensor actual coordinate according to the stroke.

8. The calibrating system as claimed in claim 5, wherein the first sensor is mounted on the robot, and the control module is adapted to control the robot to drive the first sensor to move a stroke so that the first sensor contacts an external structure, and to obtain the first sensor actual coordinate according to the stroke and a position of the external structure.

9. The calibrating system as claimed in claim 6, wherein the first object and the second sensor are mounted on one of the robot and a working platform, and the first sensor and the second object are mounted on the other of the robot and the working platform.

10. The calibrating system as claimed in claim 6, wherein the second sensor is mounted on the robot, the first sensor is mounted on a working platform, the control module is adapted to control the robot to drive the second sensor to move a stroke so that the second sensor contacts the first sensor, and to obtain a second sensor actual coordinate according to the stroke and a first sensor actual coordinate of the first sensor relative to the robot.

11. The calibrating system as claimed in claim 10, wherein the control module is adapted to control the robot to move a stroke so that the robot contacts the first sensor, and to obtain the first sensor actual coordinate according to the stroke.

* * * * *